United States Patent
Lisec et al.

(10) Patent No.: US 11,417,448 B2
(45) Date of Patent: *Aug. 16, 2022

(54) METHOD FOR MANUFACTURING A DEVICE HAVING A THREE-DIMENSIONAL MAGNETIC STRUCTURE

(71) Applicant: Fraunhofer-Gesellschaft zur Foerderung der angewandten Forschung e.V., Munich (DE)

(72) Inventors: Thomas Lisec, Itzehoe (DE); Hans-Joachim Quenzer, Itzehoe (DE); Tim Reimer, Kiel (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 222 days.

This patent is subject to a terminal disclaimer.

(21) Appl. No.: 15/621,122

(22) Filed: Jun. 13, 2017

(65) Prior Publication Data

US 2017/0278605 A1 Sep. 28, 2017

Related U.S. Application Data

(63) Continuation of application No. PCT/EP2015/079362, filed on Dec. 11, 2015.

(30) Foreign Application Priority Data

Dec. 16, 2014 (DE) .......................... 102014226138.4

(51) Int. Cl.
*H01F 1/06* (2006.01)
*H01F 41/16* (2006.01)
(Continued)

(52) U.S. Cl.
CPC ........... *H01F 1/06* (2013.01); *B81C 1/00126* (2013.01); *G01R 33/38* (2013.01);
(Continued)

(58) Field of Classification Search
None
See application file for complete search history.

(56) References Cited

U.S. PATENT DOCUMENTS 6,553,651 B2 4/2003 Reznik et al.
6,572,371 B1 6/2003 Sion et al.
(Continued)

FOREIGN PATENT DOCUMENTS

CA 2268729 A1 4/1998
CN 1171137 A 1/1998
(Continued)

OTHER PUBLICATIONS

Daubert "Effect of Meso- and Micro-Porosity in Carbon Electrodes on Atomic Layer Deposition of Pseudocapacitive V2O5 for High Performance Supercapacitors" Chem of Mater. 2015, 27, 6524-6534 (Year: 2015).*

(Continued)

*Primary Examiner* — Mandy C Louie
(74) *Attorney, Agent, or Firm* — Perkins Coie LLP; Michael A. Glenn

(57) ABSTRACT

A method for manufacturing a device having a three-dimensional magnetic structure includes applying or introducing magnetic particles onto or into a carrier element. A plurality of at least partly interconnected cavities are formed between the magnetic particles, which contact one another at points of contact, by coating the arrangement of magnetic particles and the carrier. The cavities are penetrated at least partly by the layer generated when coating, resulting in the three-dimensional magnetic structure. A conductor loop (Continued)

free-etching (under-etching) the inductor structure using a suitable mask introducing the magnetic particles into the cavity etched through arrangement is provided on the carrier or a further carrier. When a current flows through the conductor loop, an inductance of the conductor loop is changed by the three-dimensional magnetic structure, or a force acts on the three-dimensional magnetic structure or the conductor loop by a magnetic field caused by the current flow, or when the position of the three-dimensional magnetic structure is changed, a current flow is induced through the conductor loop.

14 Claims, 9 Drawing Sheets

(51) Int. Cl.

| | |
|---|---|
| H01F 41/04 | (2006.01) |
| H01F 41/30 | (2006.01) |
| H02K 33/16 | (2006.01) |
| G02B 26/08 | (2006.01) |
| H02K 15/02 | (2006.01) |
| G02B 26/10 | (2006.01) |
| B81C 1/00 | (2006.01) |
| G01R 33/38 | (2006.01) |
| H01F 10/08 | (2006.01) |
| H01F 41/32 | (2006.01) |
| H01F 21/06 | (2006.01) |
| H01F 7/06 | (2006.01) |

(52) U.S. Cl.
CPC ....... *G01R 33/3802* (2013.01); *G02B 26/085* (2013.01); *G02B 26/101* (2013.01); *H01F 10/08* (2013.01); *H01F 41/046* (2013.01); *H01F 41/16* (2013.01); *H01F 41/301* (2013.01); *H01F 41/32* (2013.01); *H02K 15/02* (2013.01); *H02K 33/16* (2013.01); *B81B 2201/034* (2013.01); *B81B 2201/042* (2013.01); *B81C 2201/0188* (2013.01); *H01F 21/06* (2013.01); *H01F 2007/068* (2013.01)

(56) References Cited

U.S. PATENT DOCUMENTS

| | | | |
|---|---|---|---|
| 6,573,623 | B2 | 6/2003 | Ohno et al. |
| 9,221,217 | B2 | 12/2015 | Lisec et al. |
| 2001/0019752 | A1 | 9/2001 | Purdy et al. |
| 2002/0076837 | A1 | 6/2002 | Hujanen et al. |
| 2002/0197622 | A1 | 12/2002 | McDevitt et al. |
| 2004/0070816 | A1 | 4/2004 | Kato et al. |
| 2004/0112937 | A1 | 6/2004 | Laermer |
| 2004/0155010 | A1 | 8/2004 | Benzel et al. |
| 2004/0241034 | A1 | 12/2004 | Mino et al. |
| 2007/0134939 | A1 | 6/2007 | Brueck et al. |
| 2007/0228862 | A1 | 10/2007 | Welchko et al. |
| 2008/0024118 | A1 | 1/2008 | Kahlman et al. |
| 2008/0160787 | A1 | 7/2008 | Lehmann |
| 2009/0243780 | A1 | 10/2009 | Inoue et al. |
| 2009/0258168 | A1 | 10/2009 | Barcock et al. |
| 2009/0280242 | A1* | 11/2009 | Winarski ............... G11B 5/706 427/130 |
| 2009/0286402 | A1 | 11/2009 | Xia et al. |
| 2010/0123456 | A1 | 5/2010 | Boeve et al. |
| 2011/0018136 | A1 | 1/2011 | Bedair et al. |
| 2013/0058785 | A1 | 3/2013 | Kellerer et al. |
| 2013/0102121 | A1 | 4/2013 | Kim et al. |
| 2013/0169381 | A1 | 7/2013 | Kim et al. |
| 2014/0023489 | A1 | 1/2014 | Fujimoto et al. |
| 2014/0023849 | A1 | 1/2014 | Lisec et al. |
| 2015/0111062 | A1 | 4/2015 | Shen |
| 2015/0147217 | A1* | 5/2015 | Johnson ............... H01F 1/0579 419/23 |
| 2015/0288269 | A1* | 10/2015 | Ruff ............... H02K 35/04 310/36 |
| 2015/0361489 | A1 | 12/2015 | Soper et al. |
| 2017/0278605 | A1 | 9/2017 | Lisec et al. |
| 2018/0029002 | A1 | 2/2018 | Lisec et al. |

FOREIGN PATENT DOCUMENTS

| | | | |
|---|---|---|---|
| CN | 1234014 A | 11/1999 | |
| CN | 1650042 A | 8/2005 | |
| CN | 1957257 A | 5/2007 | |
| CN | 102027572 A | 4/2011 | |
| CN | 104042214 A | 9/2014 | |
| DE | 10118568 A1 | 10/2002 | |
| DE | 102005010080 A1 | 9/2006 | |
| DE | 102007051977 A1 | 9/2008 | |
| DE | 102007029445 A1 | 12/2008 | |
| DE | 102011000486 A1 | 8/2012 | |
| DE | 102011010899 A1 | 8/2012 | |
| DE | 102014226138 A1 | 6/2016 | |
| DE | 102015206377 A1 | 10/2016 | |
| EP | 2584588 A1 | 4/2013 | |
| JP | 2005213556 A | 8/2005 | |
| JP | 2006032466 * | 2/2006 | ............ H01F 1/053 |
| JP | 2009088502 * | 4/2009 | ............... B22F 1/00 |
| JP | 2011173749 A | 9/2011 | |
| WO | 2008106928 A2 | 9/2008 | |
| WO | 2016096636 A1 | 6/2016 | |

OTHER PUBLICATIONS

Aoyagi, I. et al., "A Raster-Output 2D MEMS Scanner With an 8×4 MM Mirror For An Automotive Time-Of-Flight Image Sensor", W3P.129, 978-1-4673-5983-2/13 IEEE, 2013, pp. 2321-2324.

Egelkraut, Sven et al., "Polymer Bonded Soft Magnetic Particles For Planar Inductive Devices", Proc. CIPS, 2008, pp. 1-8.

Gardner, Donald S. et al., "Review of On-Chip Inductor Structures With Magnetic Films", IEEE Transactions on Magnetics, vol. 45, No. 10, Oct. 2009, pp. 4760-4766.

Glickman, Michael et al., "High-Performance Lateral-Actuating Magnetic MEMS Switch", Journal of Microelectromechanical Systems vol. 20, No. 4, Aug. 2011, pp. 842-851.

Jiahao, Zhao et al., "Fabricate High Performance RF-MEMS Inductor With A Smart Nano Magnetic Granular Film According to Function Purpose", Proceedings of the 13th IEEE International Conference on Nanotechnology, Beijing, China, Aug. 2013, pp. 789-793.

Lee, Dok W. et al., "Design and Fabrication of Integrated Solenoid Inductors with Magnetic Cores", Electronics Components and Technology Conference, IEEE 978-1-4244-2231-9/08, 2008, pp. 701-705.

Leidich, Stefan et al., "HF-MEMS Schalter Mit Ohmschen Kontakt Und Lateraler Bewegungsrichtung RF-MEMS Switch With Ohmic Contact and Lateral Actuation", Mikrosystemtechnik Kongress Poster 12.1, Oct. 2011, pp. 976-979.

Lyshevski, Sergey E. et al., "Ferrite Nanoparticles for MEMS Technology Sensors and Actuators", 11th IEEE International Conference on Nanotechnology, Portland Marriott, Aug. 2011, pp. 1252-1256.

Mano, Yasuhiko et al., "Planar Inductor With Ferrite Layers For DC-DC Converter", Transducers'05 The13th International Conference on Solid-State Sensors, Actuators and Microsystems, Jun. 2005, pp. 891-894.

Oniku, Ololade D. et al., "Permanent Magnet Microstrucutres Using Dry-Pressed Magnetic Powders", IOP Publishing Journal of Micromechanics and Microengineering, vol. 23; No. 7; Jun. 12, 2013, XP20247167A, pp. 1-11.

Raj, P. M. et al., "Novel Nanomagnetic Materials For High-Frequency RF Applications", Electronics Components and Technology Conference, 2011, pp. 1244-1249.

Rassel, Richard J. et al., "Fabrication and Characterization of a Solenoid-Type Microtransformer", IEE Transactions of Magnetics vol. 39, No. 1, Jan. 2003, pp. 553-558.

(56) References Cited

OTHER PUBLICATIONS

Sawant, Shashank G. et al., "Fabrication, Characterization, and Modeling of Fully-Batch_Fabricated Piston-Type Electrodynamic Microactuators", Journal of Microelectromechanical Systems, vol. 23, No. 1, Feb. 2014, pp. 220-229.

Sun, Xu-Ming et al., "Electrodeposition and Characterization of CoNiMnP-based Permanent Magnetic Film For MEMS Application", Proceedings of the 2011 6th IEEE International Conference on Nano/Micro Engineered and Molecular Systems, Kaohsiung, Taiwan, Feb. 2011, pp. 367-371.

Yang, C. et al., "On-Chip RF Inductors With Magnetic Nano Particles Medium", Th1B.005 Transducers 11, Jun. 2011, pp. 2801-2804.

Yang, Tzu-Shun et al., "Fabrication and Characterization of Parylene-Bonded Nd—Fe—B Powder Micromagnets", Journal of Applied physics vol. 109; No. 7; Apr. 12, 2011; American Institute of Physics, pp. 1-4.

Yu, Xuehong et al., "Silicon-Embedded Toroidal Inductors with Magnetic Cores: Design Methodology and Experimental Validation", Proc. APEC, Fort Worth, TX, 2014, pp. 763-767.

Zhan, Jing et al., "Stacked-Spiral RF Inductor With Vertical Nano-Powder Magnetic Core in CMOS", IEEE Microwave and Wireless Components Letters, vol. 22, No. 1, Jan. 2012, pp. 29-31.

perpetuum.com, [online], Retrieved from: <http://www.perpetuum.com/products/vibration-energy-harvester.asp>.

"http://sensitec.com/deutsch/produkte/winkel/winkelmessung-erlaeuterung.html", Springer-VDI-Verlag; [online] retrieved from https://www.konstruktion-online.de/Heftarchiv/2017/Ausgabe-S2/Messen-Pruefen-Ueberwachen/Neuentwicklungen-bei-magnetoresistiven-Sensoren-fuer-intelligente-Lager on Mar. 1, 2017, 2017, 1-3.

"http://www.bogen-electronic.com/Lineare_Massstaebe.html", BOGEN Electronic GmbH; [online] retrieved from http://www.bogen-electronic.com/files/bilder/PDF/Technical_Data_Sheet_LMS.pdf Mar. 15, 2018, 1-7.

Achayya, Aritra , et al., "Experimental Study on the Effect of Magnetic Field on Current-Voltage Characteristics of N-Channel Enhancement-Type MOSFET", Journal of Electron Devices, vol. 13, 2012, 945-948.

Ando, B. , et al., "Nonlinear Mechanism in MEMS Devices For Energy Harvesting Applications", J. Micromech Microeng 20 125020, 2010, 1-12.

Clark, James J., "CMOS Magnetic Sensor Arrays", Proc. IEEE Solid-State Sensor and Actuator Workshop, 1988.

Feng, Y. , et al., All-Polymer high-aspect-ratio spring with embedded electrode, Proc. IEEE Transducers Conf., Barcelona, Spain, 2013.

Galchev, T. , et al., "Non-Resonant Bi-Stable Frequency-Increased Power Scavenger From Low-Frequency Ambient Vibration", Proc. IEEE Transducers, Jun. 21-25, 2009.

Ilic , Fabrication of flexible polymer tubes for micro and nanofluidic applications, J. Vac. Sci. Technol. B 20 (6) Nov./Dec. 2002.

Lei , et al., Molecular Effusion-Boltzmann model for parylene C deposition in deep trench, Proc. IEEE Nano/Micro Engineered and Molecular Systems Conf., Xiamen, China, 2010.

Li, X. , et al., "Li Non-Resonant Electromagnetic Energy Harvester for Car-Key Applications", PowerMEMS Journal of Physics: Conference Series 476 012069, 2013.

Najafi, K. , et al., "Microsystems for Energy Harvesting", Proc. IEEE Transducers, Jun. 5-9, 2011.

Oniku, Ololade D., et al., Permanent magnet microstructures using dry-pressed magnetic powders, J. Micromech. Microeng. 23 (2013).

Reimer, Tim , et al., "Temperature-stable NdFeB micromagnets with high-energy density compatible with CMOS back end of line technology", MRS Advances, 1:3 (Jan. 2016) pp. 209-213, Dec. 25, 2015, 2019-213.

Robbins, R. , Cleanroom Research Laboratory, https://research.utdallas.edu/cleanroom/manuals/scs-parylene-deposition; Dec. 10, 2010 (update Jan. 15, 2014), Dec. 10, 2010.

Xu, Zhi-Hao , et al., "Grooved multi-pole magnetic gratings for high-resolution positioning systems", Japanese Journal of Applied Physics 54, 2015, Apr. 15, 2015, 06FP01-1 to 06FP01-5.

Yang, Tzu-Shun , et al., Fabrication and characterization of parylene-bonded Nd—Fe—B powder micromagnets, J. Appl. Phys., vol. 109, 07A753 (2011).

Yang, Tzu-Shun , et al., "Fabrication and characterization of parylene-bonded Nd—Fe-8 powder micromagnets", American Institute of Physics, Journal of Applied Physics 109, 07 A753 (2011), Apr. 12, 2011, 07A753-1 to 07A753-3.

Zhi, Chao , et al., "A polydimethylsiloxane diaphragm integrated with a sputtered thin film NdFeB magnet", Microsystem Technologies (2015) 21:675-681, Jan. 28, 2014, 675-681.

Oniku, Ololade D., et al., "Permanent magnet microstructures using dry¬pressed magnetic powders", 2013 J. Micromech, Journal of Micromechanics and Microengineering; published Jun. 12, 2013.

Yang, C. , et al., "On-chip RF inductors with magnetic nano particles medium", Solid-state; sensor, actuator and microsystems Conference (transducers 2011); Beijing China).

* cited by examiner

100

```
┌─────────────────────────────────────────────────────────┐
│ Applying or introducing magnetic particles onto or into a carrier │
│   element, wherein a plurality of at least partly interconnected  │
│ cavities are formed between the magnetic particles, and wherein   │——102
│  the magnetic particles contact one another at points of contact; │
└─────────────────────────────────────────────────────────┘
                              │
                              ▼
┌─────────────────────────────────────────────────────────┐
│      Connecting the magnetic particles at the points of contact   │
│       by coating the arrangement of magnetic particles and the    │
│    carrier element, wherein the cavities are penetrated at least  │——104
│    partly by the layer generated when coating so that the result  │
│             is the three-dimensional magnetic structure; and      │
└─────────────────────────────────────────────────────────┘
                              │
                              ▼
┌─────────────────────────────────────────────────────────┐
│ providing a conductor loop arrangement on the carrier             │
│ element or a further carrier element so that:                     │
│                                                                   │
│  - when a current flows through the conductor loop arrangement,   │
│    an inductance of the conductor loop arrangement is changed     │
│    by the three-dimensional magnetic structure; or                │
│                                                                   │
│  - when a current flows through the conductor loop arrangement,   │——106
│    a force acts on the three-dimensional magnetic structure or    │
│    the conductor loop arrangement by a magnetic field caused      │
│    by the current flow; or                                        │
│                                                                   │
│  - when a position of the three-dimensional magnetic structure    │
│    is changed once or periodically, a current flow is induced     │
│    through the conductor loop arrangement.                        │
└─────────────────────────────────────────────────────────┘
```

Fig. 3 free-etching (under-etching) the inductor structure using a suitable mask introducing the magnetic particles into the cavity etched through solidifying the particles by means of a suitable ALD process to form a porous 3D structure (solidified porous body)

removing the masking selectively to the porous 3D structure

METHOD FOR MANUFACTURING A DEVICE HAVING A THREE-DIMENSIONAL MAGNETIC STRUCTURE

CROSS-REFERENCE TO RELATED APPLICATIONS

This application is a continuation of copending International Application No. PCT/EP2015/079362, filed Dec. 11, 2015, which claims priority from German Application No. 102014226138.4, filed Dec. 16, 2014, which are each incorporated herein in its entirety by this reference thereto.

BACKGROUND OF THE INVENTION

Embodiments of the present invention relate to a method for manufacturing a device having a three-dimensional magnetic structure. Further embodiments relate to a device having a three-dimensional magnetic structure. Some embodiments relate to integrating magnetic materials onto substrates.

Very small coils can be manufactured on semiconductor substrates by means of techniques of IC (Integrated Circuit) technology. Small coils with no coil cores made from magnetic materials, however, generally exhibit a low inductance. Integrating coil cores made from suitable magnetic materials, however, is not easy at all since comparatively great layer thicknesses are used. Thus, SMD (Surface-Mounted Devices) elements are still used for electronic modules of greater inductances, wherein the coil bodies of these elements are manufactured either conventionally by winding a wire around a magnetic core or by means of ceramic technology in LTCC (Low-Temperature Cofired Ceramics). The size of SMD elements, however, typically is in the range of millimeters. In addition, SMD elements exhibit a considerable scattering as regards the quantity of the inductances. A considerable improvement in the performance of planar integrated coils on planar substrates, like silicon, may be achieved by integrating magnetic cores directly in the substrate.

Magnetic structures which can be integrated onto substrates would be of high interest not only for inductors, but also for micromechanical devices and sensors. Magnetic actuators exhibit certain advantages when compared to other driving principles. Up to now, however, high forces have been achieved only using permanent magnets mounted on the chip level. However, like in the case of inductors, this is compatible with neither the size nor the costs of miniaturized systems. In addition, mounting such magnets prevents using same in hermetically sealed casings produced by means of wafer bonding, since the temperatures used when bonding are not compatible with adhesive connections.

In contrast to high-performance hard-magnetic layers, metallic ferromagnetic layers are easy to deposit electrochemically. FIG. 1a shows a magnetically actuated ohmic MEMS (Micro-Electro-Mechanical System) switch based on a cylinder coil made of copper with a 10 μm permalloy core [M. Glickman et. al., "High-performance lateral-actuating magnetic MEMS switch", J. Micromech. Sys., Vol. 20, No. 2, 2011]. FIG. 1b shows a transformer of similar setup having a galvanically deposited NiFe core [R. J. Rassel et. al., "Fabrication and characterization of a solenoid-type microtransformer", Transact. on Magnetics, Vol. 39, No. 1, 2003]. Generally, Fe, Ni, or Co-based alloys exhibit high permeability and saturating induction. However, with an increasing frequency, the losses due to eddy currents and ferromagnetic resonance in metal increase considerably. The operating range of the transformer in [R. J. Rassel et. al., "Fabrication and characterization of a solenoid-type microtransformer", Transact. on Magnetics, Vol. 39, No. 1, 2003], for example, is limited to frequencies in the lower kHz range. [D. W. Lee et. al., "Design and fabrication of integrated solenoid inductors with magnetic cores", Proc. ECTC 2008] describes a cylinder coil having a sputtered CoTaZr core with a thickness of approximately 2 μm and good performance at several 10 MHz.

Due to their high electrical resistance, ferrites are considerably more suitable for higher-frequency applications. The permeability of these materials may be rather high, wherein the saturation induction mostly is comparably low. Due to the high temperatures, the classical manufacturing methods of ferrite magnets are not compatible with IC technology. Sputtering ferrites is problematic, since these are complex compounds made of several elements. In addition, sputtered layers may entail thermal post-treatment for adjusting the crystalline structure. Etching ferrite layers is also difficult. [Y. Mano et. al., "Planar inductors with ferrite layers for DC-DC converters, Proc. Transducers 2005, Seoul, Korea] describes a planer coil, which is embedded in a galvanically deposited Ni—Fe ferrite. Since galvanic depositions are done using photoresists, post-structuring the layers is not required.

The eddy current problem can be reduced by stacking several thin soft-magnetic layers with dielectrics. In [D. S. Gardner et. al., "Review of on-chip inductor structures with magnetic films", Transact. on Magnetics, Vol. 45, No. 10, 2009], planar coils having CoTaZr and NiFe cores having a thickness of approximately 2 μm, which consist of stacks of the sputtered magnetic material and thin cobalt oxide layers have been examined. In [J. Zhao et. al., "Fabricate high performance RF-MEMS inductor with a smart nano magnetic granular film according to function purpose, Proc. Conf. on Nanomaterials 2013, Bejing, China], inductors having a sputtered layer made of permalloy particles embedded in $SiO_2$ below and above a planar coil are described. This also allows effectively suppressing eddy currents.

Embedding magnetic particles into polymers is another possibility. In [S. Engelkraut et. al., "Polymer bonded soft magnetic particles for planar inductive devices", Proc. CIPS 2008, Nuremberg, Germany], for manufacturing transformers, polymer-bound magnetic particles are applied onto conductor boards having planar coils by means of injection molding. [P. Markondeya et. al., "Novel nanomagnetic materials for high-frequency RF applications", Proc. ECTC 2011] describes the synthesis of cobalt nanoparticles having an $SiO_2$ sheath. Embedded in a polymer matrix, like BCB (benzocyclobutene), the nanoparticles are applied onto the substrate surface by means of screen printing. Injection molding and screen printing methods are limited as regards the minimum structural width, however, structuring the polymer particle layers, for which there are no suitable methods may be omitted. An alternative of interest is printing magnetic inks, since comparatively fine structures can be produced in this way. [S. Lyshevski, K. Martirosyan, "Ferrite nanoparticles for MEMS technology sensors and actuators", Proc. Conf. on Nanotechnology, Portland, Oreg., USA, 2011] describes the synthesis of different ferrite particles and applying same onto a substrate by means of inkjet printing. In order for the particles to remain on the substrate after drying, a polymer, in this case PMMA (polmyethylmethacrylate), is added to the ink.

Most magnetically operated MEMS elements avoid the integration of magnetic materials and use Lorentz force-based actuators instead. In these driving structures, the force which the conductor tracks through which a current flows are subjected to in an external static magnetic field is made use of. The advantage of this driving principle in the end is that integrating magnetic materials in an MEMS element can be avoided. However, the forces achievable are rather limited.

Integrated magnetic actuators for operating micromechanical elements so far have been described only on the basis of galvanically deposited soft-magnetic layers, like, for example, the switch in FIG. 1a [M. Glickman et. al. "High-performance lateral-actuating magnetic MEMS switch", J. Micromech. Sys., Vol. 20, No. 2, 2011]. Strictly speaking, this is a special case, since only a narrow gap in a magnetic core is closed by applying an external voltage. The structural size and force generated are comparable to that of lateral electrostatically actuated switches, as described in [S. Leidich et. al., "RF-MEMS switch with ohmic contact and lateral actuation", Proc. Microsystemtechnik Kongress 2011, Darmstadt, Germany], for example.

Considerable advantages of integrated magnetic drives are large strokes and high forces. In addition, this driving principle allows using external coils, thereby achieving high forces and strokes using this hybrid approach. Since the magnetic forces achievable are dependent on the dimensions of the magnetic structure, large thicknesses are of advantage. Since magnetic actuators are operated in the low-frequency range or using a direct current, the loss mechanisms important for inductors are not of importance here.

Methods like sputtering or PLD (Pulsed Laser Deposition), however, are suitable only for layers having a thickness of only a few µm. Thicker layers can be generated by means of galvanic deposition [X.-M. Sun et. al., "Electrodeposition and characterization of CoNiMnP-based permanent magnetic film for MEMS applications", Proc. NEMS 2011, Kaohsiung, Taiwan]. However, due to stress effects, galvanic metal layers having a thickness of a few 10 µm may already become problematic. In addition, hard-magnetic materials are able to achieve higher forces than when using soft-magnetic ones. However, depositing same is considerably more difficult, in particular when using high-performance materials, like SmCo or NdFeB for high-field magnets.

Thus, miniature permanent magnets are still mounted on the chip level for many magnetic actuators. A current example of this is the 2D scanner in [I. Aoyagi et. al., "A raster-output 2D MEMS scanner with an 8×4 mm mirror for an automotive time-of-flight image sensor", Proc. Transducers 2013, Barcelona, Spain], see FIGS. 2a-2d. Only the movable structure or the frame thereof is made of silicon. In another example, [Yu et. al., "Silicon-embedded toroidal inductors with magnetic cores: Design methodology and experimental validation", Proc. APEC 2014, Fort Worth, Tex., USA], a coil having a magnetic core is produced on a silicon substrate by embedding a ring-shaped permanent magnet in an etched cavity. Metallic conductive traces were deposited into the cavity before. After embedding the magnet, these are connected to form a coil by a second conductive trace level.

SUMMARY

According to an embodiment, a method for manufacturing a device having a three-dimensional magnetic structure may have the steps of: applying or introducing magnetic particles onto or into a carrier element, wherein a plurality of at least partly interconnected cavities are formed between the magnetic particles, and wherein the magnetic particles contact one another at points of contact; connecting the magnetic particles at the points of contact by coating the arrangement of magnetic particles and the carrier element, wherein the cavities are penetrated at least partly by the layer generated when coating so that the result is the three-dimensional magnetic structure, wherein coating the arrangement of magnetic particles and the carrier element is performed by means of atomic layer deposition; and providing a conductor loop arrangement on the carrier element or a further carrier element so that: when a current flows through the conductor loop arrangement, an inductance of the conductor loop arrangement is changed by the three-dimensional magnetic structure; or when a current flows through the conductor loop arrangement, a force acts on the three-dimensional magnetic structure or the conductor loop arrangement by a magnetic field caused by the current flow; or when a position of the three-dimensional magnetic structure is changed once or periodically, a current flow is induced through the conductor loop arrangement.

Another embodiment may have a device having a three-dimensional magnetic structure which is manufactured by the above inventive method.

Embodiments of the present invention provide a method for manufacturing a device having a three-dimensional magnetic structure. The method comprises a step of applying or introducing magnetic particles onto or into a carrier element, wherein a plurality of at least partly interconnected cavities are formed between the magnetic particles, and wherein the magnetic particles contact one another at points of contact. The method additionally comprises a step of connecting the magnetic particles at the points of contact by coating the arrangement of magnetic particles and the carrier element, wherein the cavities are penetrated at least partly by the layer generated when coating so that the result is a three-dimensional magnetic structure. Furthermore, the method comprises a step of providing a conductor loop arrangement on the carrier element or a further carrier element so that, (1) when a current flows through the conductor loop arrangement, an inductance of the conductor loop arrangement is changed by the three-dimensional magnetic structure, (2) when a current flows through the conductor loop arrangement, a force acts on the three-dimensional magnetic structure or the conductor loop arrangement by a magnetic field caused by the current flow, or (3) when the position of the three-dimensional magnetic structure is changed (once or periodically), a current flow is induced through the conductor loop arrangement.

The present invention is based on the idea of manufacturing a three-dimensional magnetic structure for achieving high inductances in coil applications or high magnetic driving forces in actuator applications by introducing (or applying) magnetic particles into (or onto) a carrier element and subsequently coating the arrangement of magnetic particles by depositing a layer.

BRIEF DESCRIPTION OF THE DRAWINGS

Embodiments of the present invention will be detailed subsequently referring to the appended drawings, in which:

FIG. 3 is a flow chart of a method for manufacturing a device having a three-dimensional magnetic structure in accordance with an embodiment of the present invention;

DETAILED DESCRIPTION OF THE INVENTION

Figure 1A:
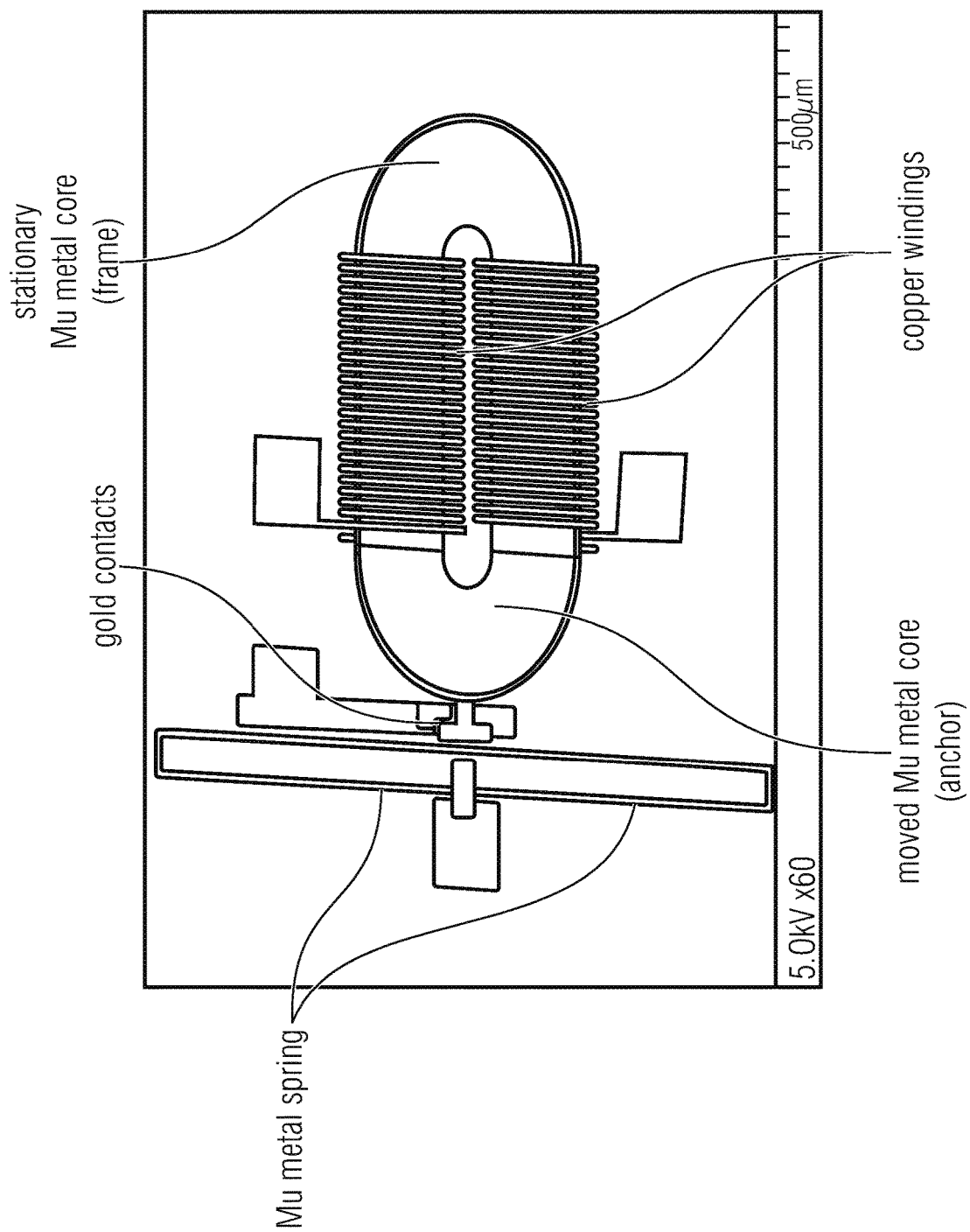
FIG. 1a is a schematic view of a micromechanical ohmic switch based on cylinder coils having a galvanically deposited NiFe core.
Figure 1B:
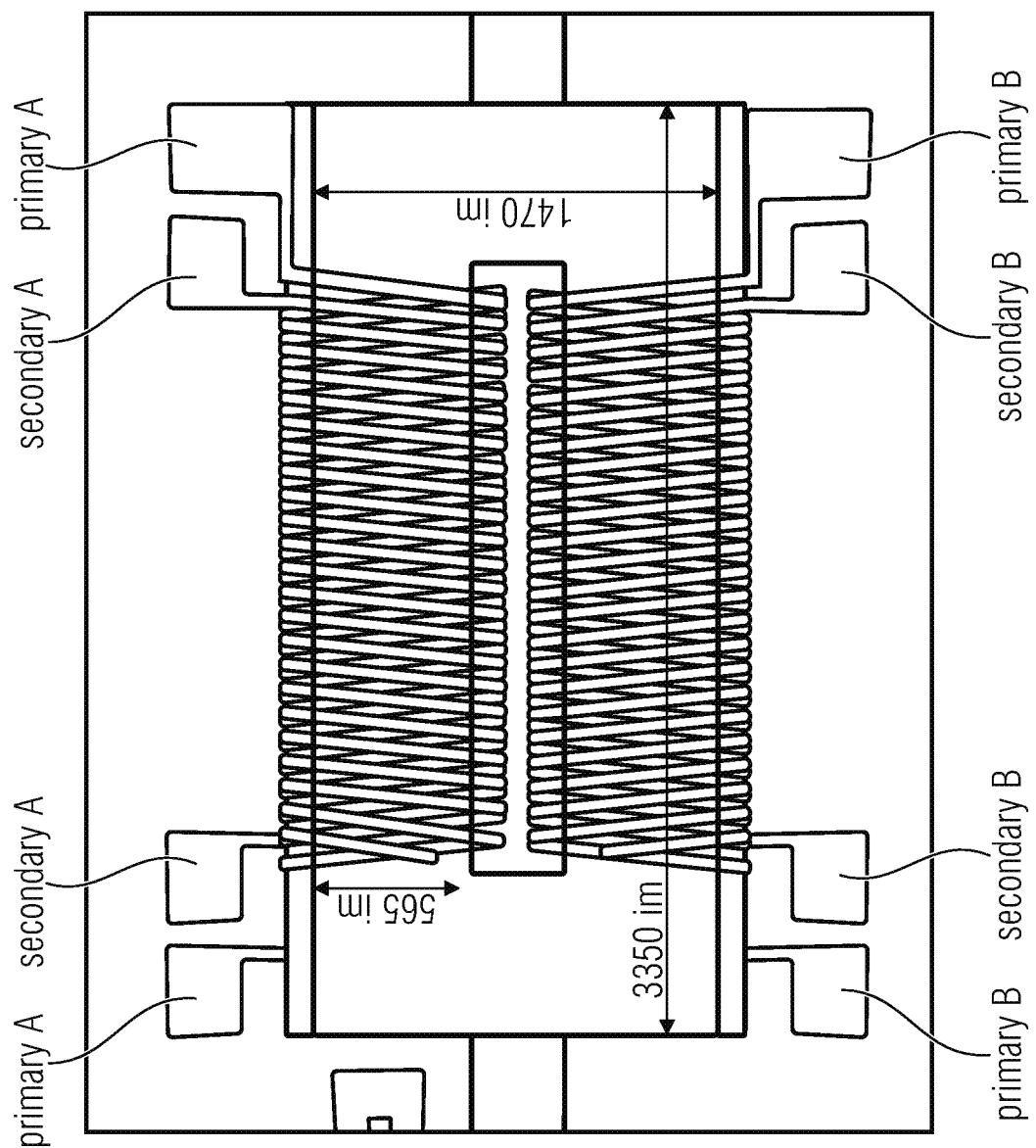
FIG. 1b is a schematic view of a micromechanical transformer based on cylinder coils having a galvanically deposited NiFe core.
Figure 2A:
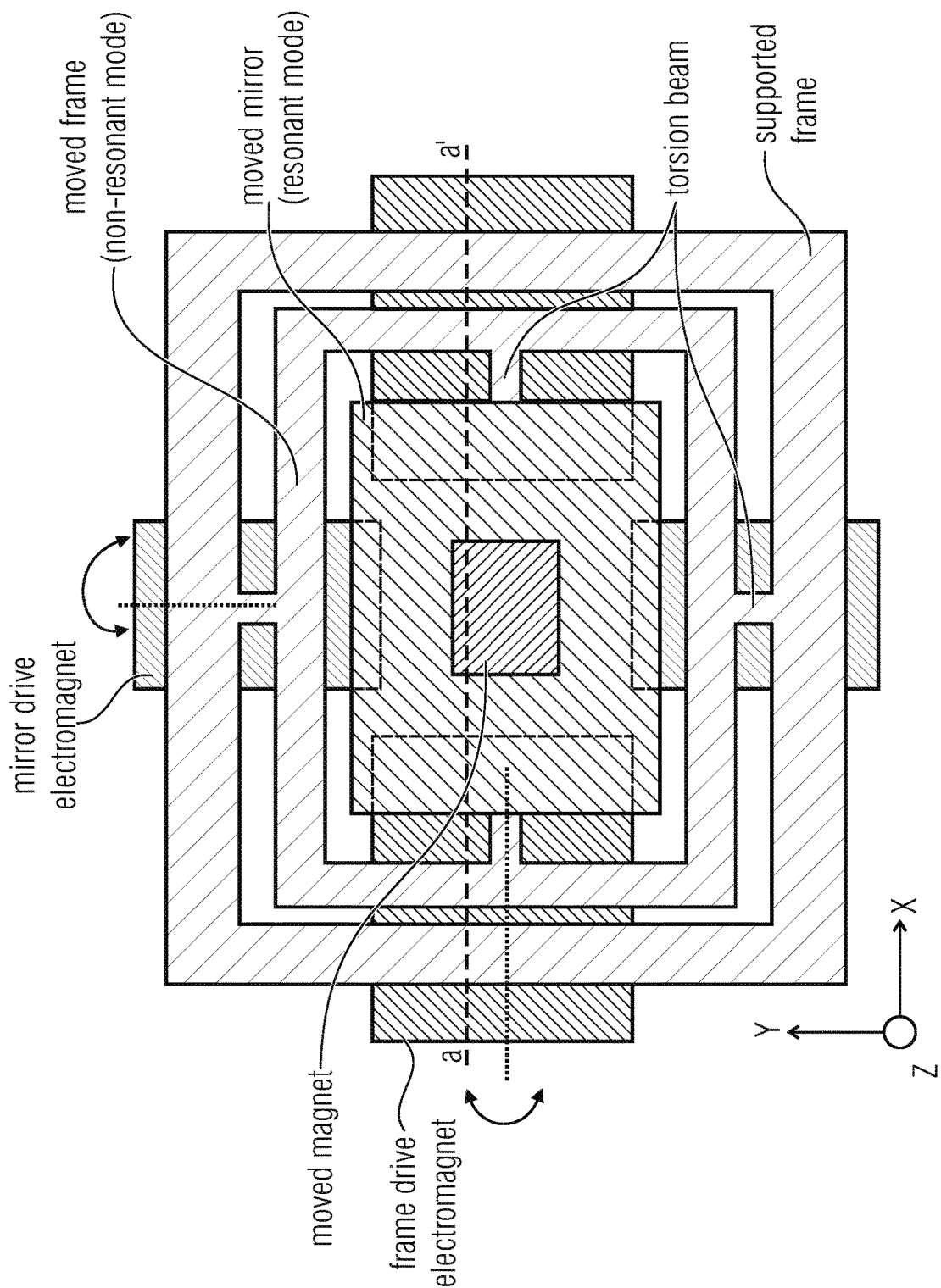
FIG. 2a is a schematic top view of a setup of a 2D scanner.
Figure 2B:
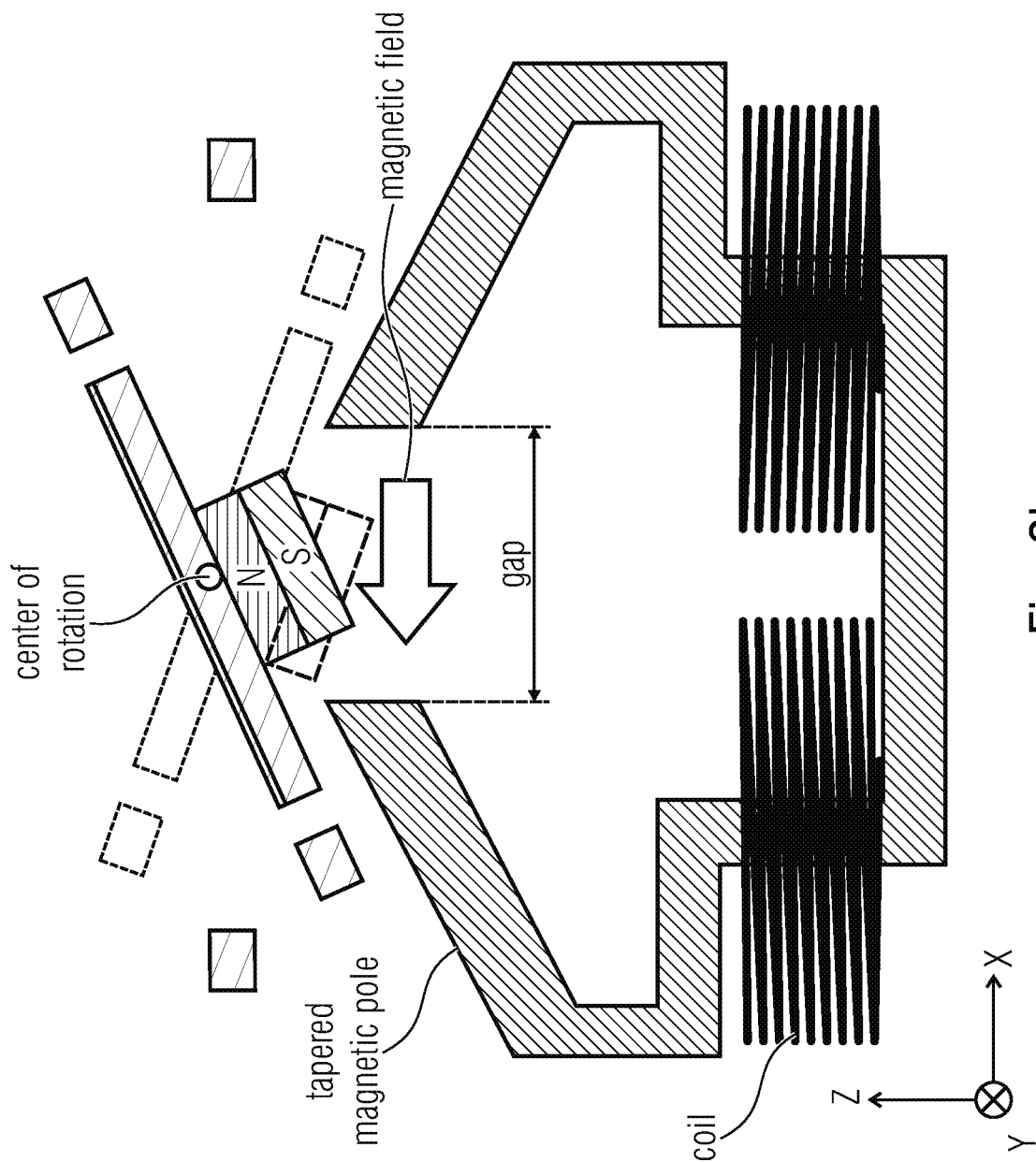
FIG. 2b is a schematic side view of a setup of a 2D scanner.
Figure 2C:
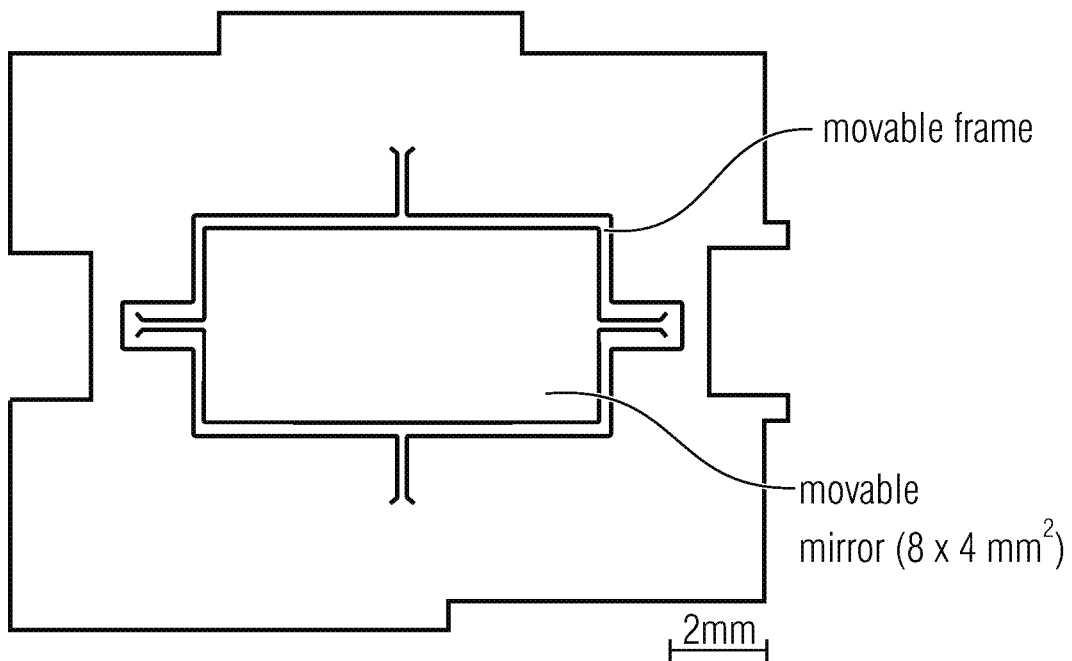
FIG. 2c shows a picture of a first side of an Si chip having a magnet mounted thereon.
Figure 2D:
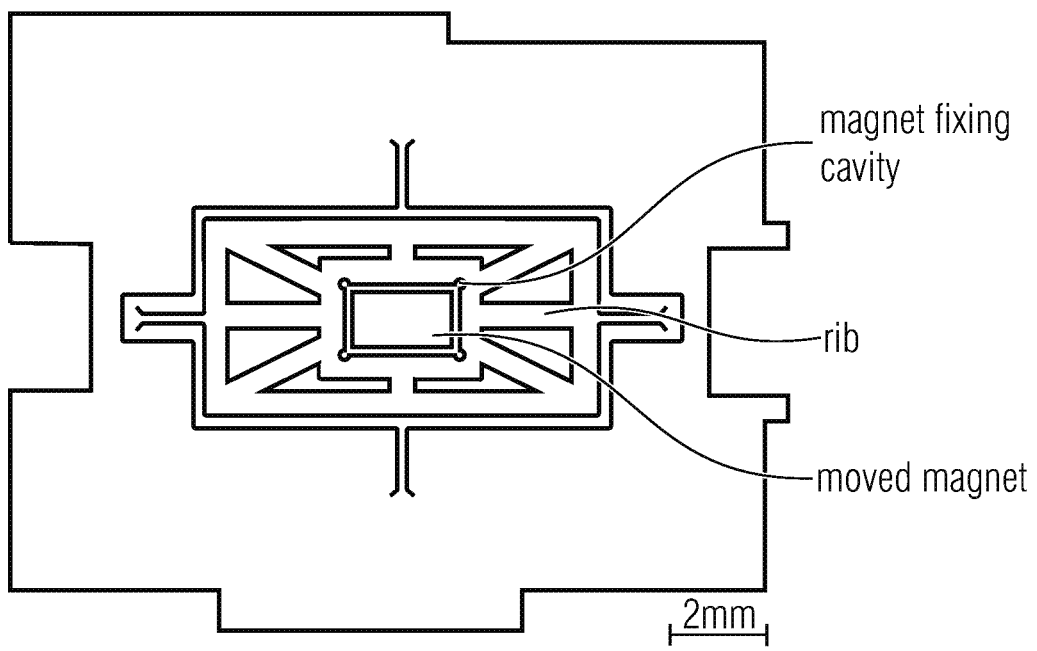
FIG. 2d shows a picture of a second side of the Si chip having the magnet mounted thereon.

In the following description of embodiments of the invention, equal elements or elements of equal effect in the Figures are provided with equal reference numerals so that the description thereof in the different embodiments is mutually exchangeable.

FIG. 3 shows a flow chart of a method 100 for manufacturing a device having a three-dimensional magnetic structure. The method 100 comprises a step 102 of applying or introducing magnetic particles onto or into a carrier element, wherein a plurality of at least partly interconnected cavities are formed between the magnetic particles, and wherein the magnetic particles contact one another at points of contact. The method 100 additionally comprises a step 104 of connecting the magnetic particles at the points of contact by coating the arrangement of magnetic particles and the carrier element, wherein the cavities are penetrated at least partly by the layer generated when coating so that the result is the three-dimensional magnetic structure. In addition, the method 100 comprises a step 106 of providing a conductor loop arrangement on the carrier element or a further carrier element so that, when a current flows through the conductor loop arrangement, an inductance of the conductor loop arrangement is changed by the three-dimensional magnetic structure, or so that, when a current flows through the conductor loop arrangement, a force acts on the three-dimensional magnetic structure or the conductor loop arrangement by a magnetic field caused by the current flow, or so that, when the position of the three-dimensional magnetic structure is changed (like once or periodically), a current flow is induced through the conductor loop arrangement.

In accordance with embodiments, a three-dimensional magnetic structure for achieving high inductances in coil applications or high magnetic driving forces in actuator applications is manufactured by introducing (or applying) magnetic particles into (or onto) a carrier element and subsequently coating the arrangement of magnetic particles by depositing a layer.

In order to further increase the inductances achievable in coil applications or the magnetic driving forces in actuator applications, in embodiments, the layer deposited, which the magnetic particles are connected to, may also be magnetic.

Coating the arrangement of magnetic particles and carrier elements may, for example, be performed by means of a CVD (Chemical Vapor Deposition) method, atomic layer deposition or atomic vapor deposition. In addition, it is possible to deposit a magnetic material in an oxidized form so as to obtain the magnetic layer. Furthermore, a magnetic material in an oxidized form can be deposited and reduced subsequently in order to obtain the magnetic layer.

Furthermore, a dielectric layer can be deposited before or after depositing the magnetic layer. The arrangement of magnetic particles may thus be functionalized further by multiple coating, wherein coating by a magnetic material may, for example, follow a first coating by a dielectric material, and vice versa.

In other words, the magnetic particles may be interconnected or fixed in embodiments by means of an ALD (Atomic Layer Deposition) process. Here, any material which is compatible with the mounting process, i.e. ALD deposition, can be applied or introduced onto or into the carrier material (e.g. substrate). A high packing density can be achieved using the method mentioned above.

The ALD layers here may be made of magnetic materials, like Fe, Ni, or Co oxides, or compounds or mixtures thereof. Metallic materials, like Fe, Ni and Co, and the alloys thereof are also possible for manufacturing magnetic or hard-magnetic structures. Since these materials cannot simply be deposited directly by means of ALD, the corresponding oxides (Fe, Ni, Co and mixtures thereof) are deposited at first and then, the oxide is transferred to the corresponding metals and metal alloys by means of a chemical reduction.

When compared to polymer-bound systems for manufacturing the permanent magnets, it should be possible to manufacture considerably smaller magnetic structures with dimensions of only a few µm in a reproducible manner.

The method 100 for manufacturing a device having a three-dimensional magnetic structure, as shown in FIG. 3, will be described below in detail making reference to FIGS. 4a to 6e.

Figure 4B:
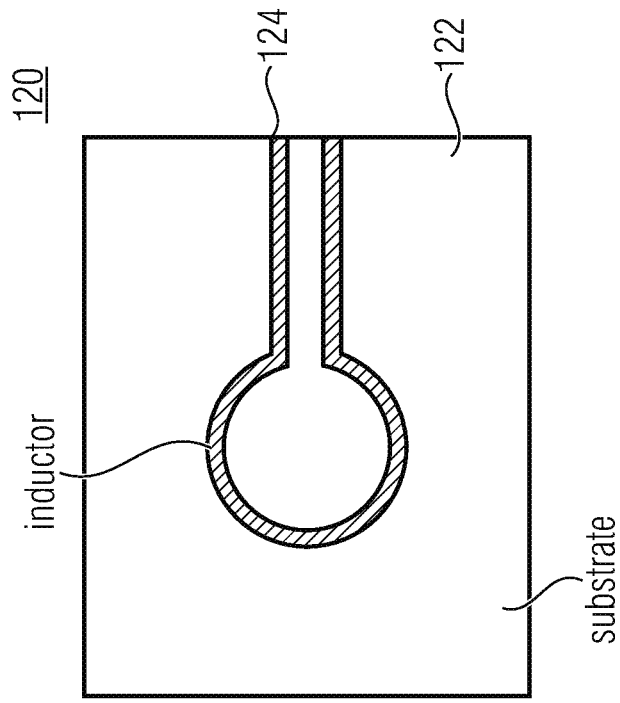
FIG. 4b is a schematic top view of the conductor loop arrangement, shown in FIG. 4a, on the carrier element in accordance with an embodiment of the present invention.
Figure 4A:
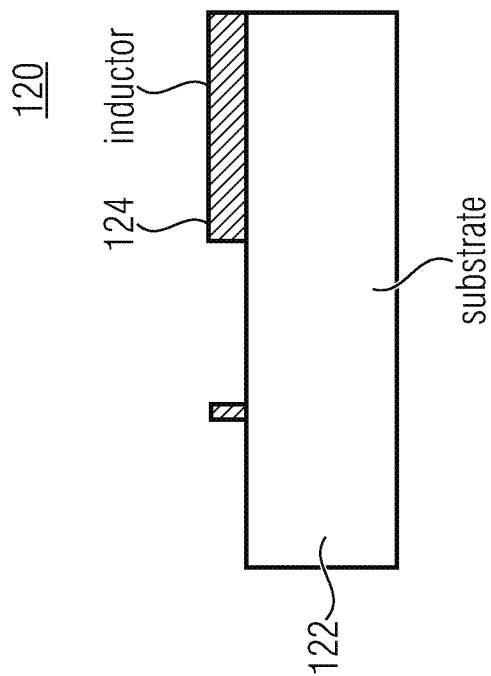
FIG. 4a is a schematic cross-sectional view of a conductor loop arrangement on a carrier element in accordance with an embodiment of the present invention.

As has been mentioned already, the method 100 for manufacturing a device having a three-dimensional magnetic structure comprises a step 106 of providing a conductor loop arrangement on the carrier element or a further carrier element. FIG. 4a shows a schematic cross-sectional view of the device 120 after the step of providing a conductor loop arrangement 124 on the carrier element (e.g. substrate), whereas FIG. 4b is a schematic top view thereof. The carrier element 122 shown in FIGS. 4a and 4b may of course also be the further carrier element. The carrier element 122 (or the further carrier element) may, for example, comprise plastic, silicon, glass or ceramics, or be a conductor board. The conductor loop arrangement 124 may, for example, be a (planar) coil or a (planar) inductor.

In addition, the method comprises a step 102 of applying or introducing magnetic particles onto or into the carrier element 122 and a step of connecting the magnetic particles by coating so that the result is the three-dimensional magnetic structure on or in the carrier element.

In coil applications, the conductor loop arrangement 124 may, for example, be provided on the carrier element 122, i.e. on the same carrier element as the three-dimensional magnetic structure (in other words, the conductor loop arrangement and the three-dimensional magnetic structure are arranged on the carrier element 122) so that an inductance of the conductor loop arrangement 124 is changed (increased or decreased, for example) by the three-dimensional magnetic structure. In actuator applications, the conductor loop arrangement 124 may, for example, be provided on the further carrier element so that, when a current flows through the conductor loop arrangement 124, a force acts on the three-dimensional magnetic structure or the conductor loop arrangement 124 by a magnetic field caused by the current flow. For sensor applications or energy harvesters, it is also possible for an electrical current to be induced in the conductor loop arrangement 124 provided on the further carrier element by changing the position of the three-dimensional magnetic structure on the carrier element 122 once, or by moving same periodically.

Subsequently, a method 100 for manufacturing a device 120 having a three-dimensional magnetic structure will be described below referring to FIGS. 5a to 5d, wherein the conductor loop arrangement 1 to 4 is provided on the same carrier element 122 as is the three-dimensional magnetic structure so that an inductance of the conductor loop arrangement 124 is changed by the three-dimensional magnetic structure.

Figure 5A:
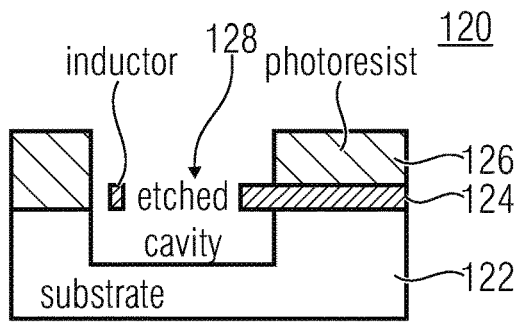
FIGS. 5a to 5d are schematic cross-sections of a device having a three-dimensional magnetic structure and a conductor loop arrangement after different manufacturing steps.

FIG. 5a shows a schematic cross-sectional view of the device 120 after a step of providing a masking 126 on the carrier element 122 and the conductor loop arrangement 124 and a step of etching the carrier element 122 in a region defined by the masking 126 in order to obtain a cavity 128 in the carrier element 122 in the region of the conductor loop arrangement 124. Thus, the conductor loop arrangement (inductor structure) 124, as is shown in FIG. 5a, may be etched free (or under-etched) using a suitable masking.

Figure 5B:
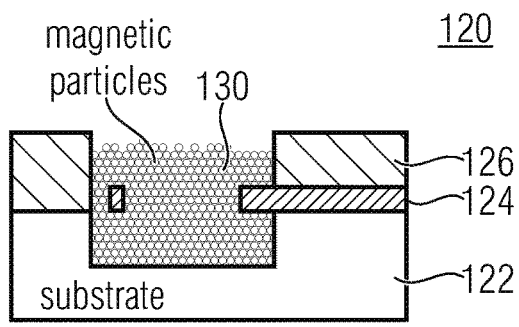

FIG. 5b shows a schematic cross-sectional view of the device 120 after step 102 of applying or introducing the magnetic particles 130 onto or into the carrier element 122. Applying or introducing the magnetic particles 130 here may take place such that the conductor loop arrangement 124 includes (or encloses) the magnetic particles 130 at least partly, i.e. such that the magnetic particles 130 are arranged at least partly within the conductor loop arrangement 124. In addition, applying or introducing the magnetic particles 130 may take place such that the magnetic particles include (or enclose) the conductor loop arrangement 124 at least partly, i.e. the magnetic particles 130 are arranged at least partly outside the conductor loop arrangement 224, for example arranged around the conductor loop arrangement 124. In FIG. 5b, the magnetic particles 130 are arranged both within and outside the conductor loop arrangement 124. FIG. 5b shows the device 120 after introducing the magnetic particles 130 into the cavity 128 etched.

Figure 5C:
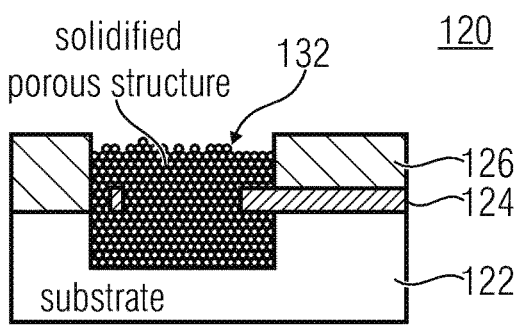

FIG. 5c shows a schematic cross-sectional view of the device 120 after step 104 of connecting the magnetic particles 130 at the points of contact by coating the arrangement of magnetic particles 130 and the carrier element 122, wherein the cavities are penetrated at least partly by the layer generated when coating so that the result is the three-dimensional magnetic structure 132. In other words, FIG. 5c shows a schematic cross-sectional view of the device 120 after solidification of the particles 130 by a suitable ALD process to form a porous three-dimensional structure or solidified porous body.

Figure 5D:
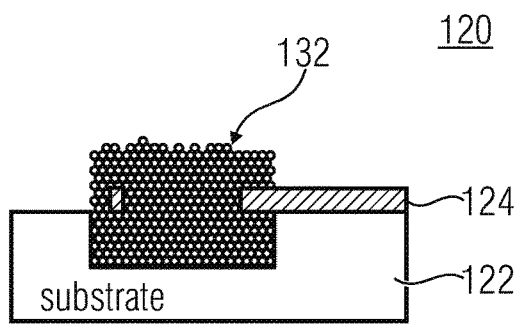

FIG. 5d shows a schematic cross-sectional view of the device 120 after a step of removing the masking 126 selectively relative to the porous three-dimensional structure 132. The inductance of the conductor loop arrangement 124 is changed by the three-dimensional magnetic structure 132.

In other words, FIGS. 5a to 5d schematically illustrate how the conductor loop arrangement (inductor structure) 124 can be provided with a magnetic sheath. At first, the conductor loop arrangement (inductor structure) 124 may be etched free or under-etched by means of a suitable masking, like a photoresist (FIG. 5a). Here, different dry-etching processes are available in IC (Integrated Circuit) technology. Subsequently, the particles 130 can be applied (FIG. 5b). This may take place both in a dry manner and also from a suitable suspension of low viscosity and good wetting so that the particles 130 may easily arrive below the conductor loop arrangement (inductor 124). For polymer-bound particles, as used in [S. Engelkraut et. al., "Polymer bonded soft magnetic particles for planar inductive devices", Proc. CIPS 2008, Nuremberg, Germany], [P. Markondeya et. al., "Novel nanomagnetic materials for high-frequency RF applications", Proc. ECTC 2011], and [S. Lyshevski, K. Martirosyan, "Ferrite nanoparticles for MEMS technology sensors and actuators", Proc. IEEE Conf. on Nanotechnology, Portland, Oreg., USA, 2011], this is not possible, since the starting material is very low-viscous and needs to adhere well. After drying (if used), the loose particles 130 are connected to one another by means of an ALD process, like $Al_2O_3$ (FIG. 5c). When using $Al_2O_3$, the advantage is that it can be deposited already at ambient temperature and is thus compatible to conventional photoresists. The smaller the particles 130, the thinner the ALD layer can be. 10 to 50 nm are sufficient with particle sizes of up to 1 μm. Subsequently the photoresist 126 can be removed (FIG. 5d). After that, a conventional PECVD (Plasma-Enhanced Chemical Vapour Deposition) layer for passivating the structure can be deposited. When the particles 130 are to be connected by a magnetic layer, like $Fe_2O_3$ or NiO, which entails a depositing temperature of 200° C., different masking may be used instead of the photoresist. The photoresist may also be removed before introducing the particles 130 when the latter may, for example, be done by dispensing (like inkjet printing). The porous magnetic structure 132 may also be generated only above the conductor loop arrangement (inductor) 124 with no previous free-etching.

Subsequently, a method 100 for manufacturing a device 120 having a three-dimensional magnetic structure 132 will be described below referring to FIGS. 6a to 6e, wherein the conductor loop arrangement 124 is provided such that, when a current flows through the conductor loop arrangement 124, a force acts on the three-dimensional magnetic structure 132 or the conductor loop arrangement 124 by a magnetic field caused by the current flow.

In other words, it will be shown below making reference to FIGS. 6a to 6e that magnetic structures may similarly be generated also on movable elements, like a mirror plate of a scanner or the actuator of a loudspeaker, in order to replace adhering hard magnets (e.g. made of SmCo or NdFeB) on the chip level. On the one hand, considerably finer structures may be generated in this way. On the other hand, the reproducibility of the structures can be higher. In addition, the method can be cheaper due to manufacturing on the wafer level.

Figure 6A:
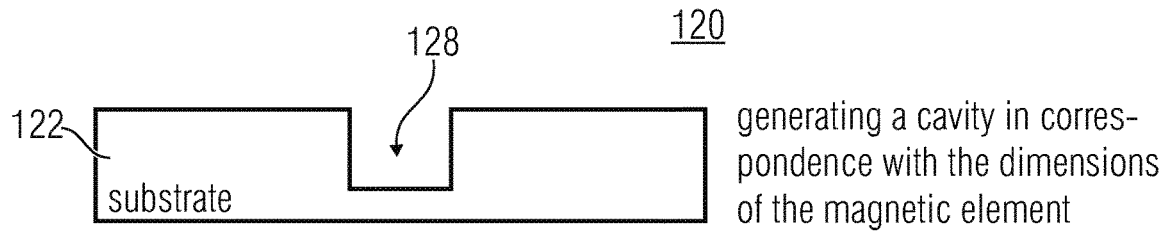
FIGS. 6a to 6e are schematic cross-sections of a device having a three-dimensional magnetic structure and a conductor loop arrangement after different manufacturing steps.

FIG. 6a shows a schematic cross-sectional view of the device 120 after a step of providing a carrier element 122 having a cavity 128. The cavity 128 here may be generated in correspondence with the dimensions of the three-dimensional magnetic structure 132.

Figure 6B:
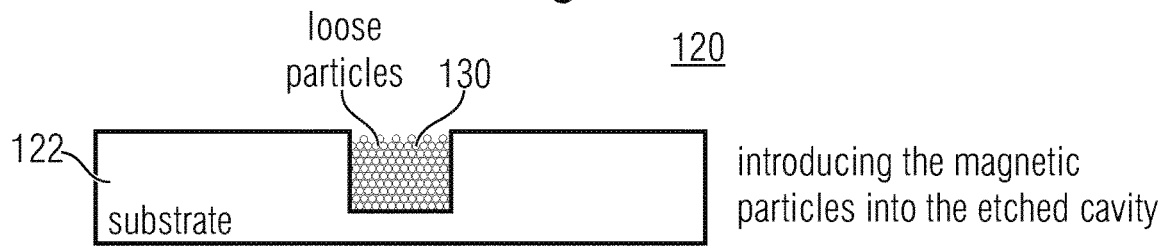

FIG. 6b shows a schematic cross-sectional view of the device 120 after the step 102 of introducing magnetic particles 130 into the (etched) cavity 128 of the carrier element 122, wherein a plurality of at least partly interconnected cavities are formed between the magnetic particles 130, and wherein the magnetic particles 130 contact one another at points of contact.

Figure 6C:
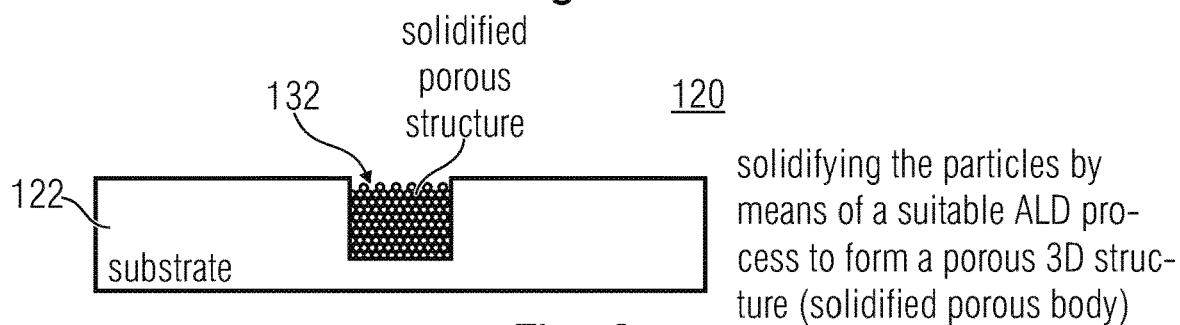

FIG. 6c shows a schematic cross-sectional view of the device 120 after step 104 of connecting the magnetic particles 130 at the points of contact by coating the arrangement of magnetic particles 130 and the carrier element 122, wherein the cavities are penetrated at least partly by the layer generated when coating so that the result is the three-dimensional magnetic structure 132. Thus, the particles 130 are solidified to form a porous three-dimensional structure or solidified porous body 132 by means of a suitable ALD process.

Figure 6D:
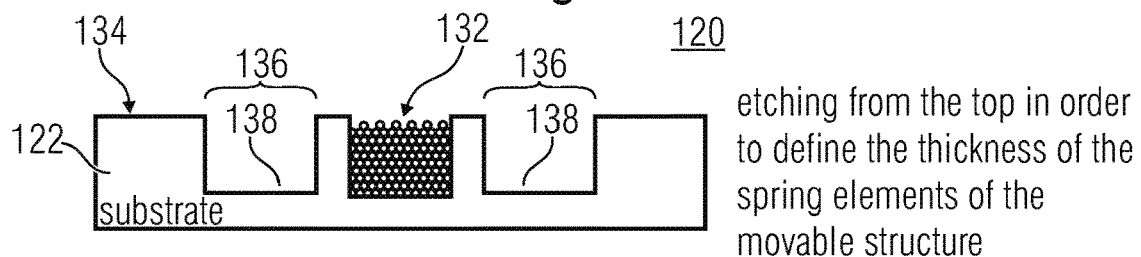

FIG. 6d shows a schematic cross-sectional view of the device 120 after a step of etching the carrier element 122 when starting from a top side 134 of the carrier element 122 in a region 136 around the three-dimensional magnetic structure 132 in order to obtain a cavity 138 which defines the thickness of spring elements of a movable structure.

Figure 6E:
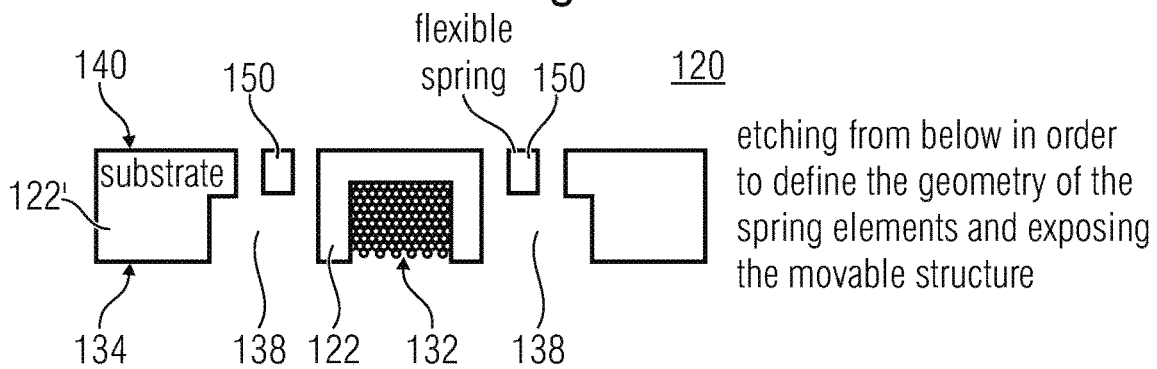

FIG. 6e shows a schematic cross-sectional view of the device 102 after a step of etching the carrier element 122 when starting from a lower side 140 of the carrier element 122 for defining the geometry of the spring elements and exposing the movable structure.

As can be recognized in FIG. 6e, the carrier element 122 is separated into two carrier elements 122 and 122' by the last etching process, i.e. in a carrier element 122 and a further carrier element 122'. In embodiments, a carrier element 122 and a further carrier element 122' may of course also be provided (independently of each other).

The conductor loop arrangement 124 (not shown) may, for example, be provided on the further carrier element 122', wherein the carrier element 122 and the further carrier element 122' are coupled to each other via the spring elements 150 so that a relative deflection between the carrier element 122 and the further carrier element 122' is caused by the force acting on the three-dimensional magnetic structure 132 by a magnetic field caused by the current flow.

Thus, the carrier element 122 may be arranged to be movable and the further carrier element 122' to be fixed. Of course, the further carrier element 122' may also be arranged to be movable and the carrier element 122 to be fixed.

In other words, a possible manufacturing process is illustrated schematically in FIGS. 6a to 6e. A cavity in which the magnetic body is to be located can be generated (FIG. 6a). The cavity 128 can be filled with magnetic particles 130 (FIG. 6b), with or without masking the substrate surface 134. Subsequently, the particles 130 can be solidified by means of ALD (FIG. 6c). After that, the movable structure can be defined. In this case, etching may at first take place from the front side 134 in order to determine the thickness of the spring elements (FIG. 6d). By subsequently etching from the lower side 140, the geometry of the spring elements can be defined and the movable structure be exposed (FIG. 6e).

Embodiments of the present invention relate to generating a magnetic core on a coil or metallic conductive trace or around a coil or metallic conductive trace by applying or introducing magnetic particles in a predetermined form onto the coil or metallic conductive trace or into a cavity completely or partly enclosing the coil or metallic conductive trace and connecting the particles to form a porous three-dimensional body by means of ALD.

Embodiments relate to generating magnetic three-dimensional bodies having different geometries with dimensions of several μm up to several mm for magnetically driving micromechanical elements, like mirrors, loudspeakers, switches or relays, by introducing particles in a certain form on a substrate where the micromechanical element is located completely or only partly, and subsequently solidifying same by means of ALD.

Embodiments are suitable for manufacturing inductors or micromechanical actuators on a planar substrate. Silicon, gallium arsenide, glass, ceramics, conductor boards, plastics and metals may be used for the substrate material.

In embodiments, the particles used may comprise a size of, advantageously, several 10 nm up to 10 μm and may be made of any soft- or ferromagnetic and even hard-magnetic materials, which are compatible with the following processes, in particular ALD deposition for connecting the particles.

In embodiments, magnetic layers, like iron, nickel or cobalt oxides, for example, may also be deposited for connecting the particles by means of ALD apart from normal dielectrics, like $Al_2O_3$ and $TiO_2$, for example. These oxides may also be transformed to metals by a subsequent chemical reduction, wherein greater magnetic field strengths can be achieved, in particular for manufacturing hard-magnetic components.

In embodiments, when the coil is part of an active integrated circuit on a semiconductor substrate, the porous magnetic core can be generated after completely finishing same.

In embodiments, the magnetic three-dimensional body may also be manufactured at the beginning of the process and be protected from following processes by means of suitable passivation layers when the magnetic three-dimensional body is used for an actuator, like using a hard-magnetic powder, for example.

In embodiments, a substrate can be connected to the magnetic three-dimensional bodies or also an individual chip can be connected to further substrates or chips to the micromechanical element by suitable processes.

In embodiments, particularly high-performance magnetic materials may be used, which cannot be integrated on a substrate by means of other methods in an IC-compatible way or in the respective dimensions.

In embodiments, magnetic structures of highly differing sizes can be manufactured on a plurality of different substrates.

In embodiments, magnetic materials can be deposited by means of ALD for connecting the particles, thereby further improving the characteristics of the magnetic body.

Embodiments allow using particularly high-performance magnetic materials, which cannot be integrated onto a substrate by means of other methods in an IC-compatible manner or in the respective dimensions.

In embodiments, magnetic structures of highly differing sizes can be manufactured on a plurality of different substrates.

In embodiments, the characteristics of the magnetic body can be improved when depositing magnetic materials by means of ALD for connecting the particles, for example.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for manufacturing a device comprising a three-dimensional magnetic structure, the method comprising:
    applying or introducing magnetic particles onto or into a carrier element, the magnetic particles comprising a size between 10 nm and 10 µm, wherein a plurality of at least partly interconnected cavities are formed between the magnetic particles, and wherein the magnetic particles contact one another at points of contact;
    connecting the magnetic particles at the points of contact by coating the arrangement of magnetic particles and the carrier element, wherein the cavities are penetrated at least partly by a magnetic layer generated based on coating so that the result is the three-dimensional magnetic structure, wherein coating the arrangement of magnetic particles and the carrier element is performed by atomic layer deposition to form the magnetic layer and comprises depositing a dielectric layer after forming the magnetic layer; and
    providing a conductor loop arrangement on the carrier element or a further carrier element, such that:
        when a current flows through the conductor loop arrangement, an inductance of the conductor loop arrangement is changed by the three-dimensional magnetic structure; or
        when a current flows through the conductor loop arrangement, a force acts on the three-dimensional magnetic structure or the conductor loop arrangement by a magnetic field caused by the current flow; or
        when a position of the three-dimensional magnetic structure is changed once or periodically, a current flow is induced through the conductor loop arrangement.

2. The method in accordance with claim 1, wherein applying or introducing the magnetic particles onto or into the carrier element takes place such that the conductor loop arrangement encloses the magnetic particles at least partly or the magnetic particles enclose the conductor loop arrangement at least partly.

3. The method in accordance with claim 2, wherein the carrier element comprises a cavity in the region of the conductor loop arrangement, and wherein the magnetic particles are introduced into the cavity such that the conductor loop arrangement encloses the magnetic particles at least partly or the magnetic particles enclose the conductor loop arrangement at least partly.

4. The method in accordance with claim 1, wherein, when providing the conductor loop arrangement, a plurality of mutually insulated conductor loop arrangements are provided, wherein applying or introducing the magnetic particles takes place such that the plurality of conductor loop arrangements are inductively coupled to one another by means of the magnetic particles.

5. The method in accordance with claim 1, wherein the conductor loop arrangement is pro-vided on the further carrier element, wherein the carrier element and the further carrier element are coupled to each other by means of spring elements so that a relative deflection between the carrier element and the further carrier element is caused by the force acting on the three-dimensional magnetic structure by a magnetic field caused by the current flow.

6. The method in accordance with claim 5, wherein the carrier element is arranged to be movable and the further carrier element to be fixed.

7. The method in accordance with claim 5, wherein the further carrier element is arranged to be movable and the carrier element to be fixed.

8. The method in accordance with claim 1, wherein coating the arrangement of magnetic particles and the carrier element further comprises:
    depositing a magnetic material in an oxidized form; and
    reducing the magnetic material in the oxidized form in order to achieve the magnetic layer.

9. The method in accordance with claim 1, wherein the magnetic particles comprise soft- and/or hard-magnetic materials.

10. The method in accordance with claim 1, wherein the arrangement of magnetic particles is magnetized to a preferential direction after coating.

11. The method in accordance with claim 1, wherein the carrier element and/or the further carrier element comprise(s) plastics, silicon, glass or ceramics.

12. The method in accordance with claim 1, wherein the carrier element and/or the further carrier element are(is) a conductor board.

13. The method in accordance with claim 1, wherein applying or introducing magnetic particles and/or connecting the magnetic particles take(s) place such that the three-dimensional magnetic structure comprises a circular shape comprising alternating soft- and hard-magnetic portions.

14. The method in accordance with claim 1, wherein coating the arrangement of magnetic particles and the carrier element further comprises:
    depositing a magnetic material in an oxidized form in order to achieve the magnetic layer.

* * * * *